United States Patent
Onodera et al.

(10) Patent No.: US 8,117,015 B2
(45) Date of Patent: Feb. 14, 2012

(54) ANALYTICAL MODEL CREATION SYSTEM

(75) Inventors: Makoto Onodera, Mito (JP); Yoshimitsu Hiro, Yokohama (JP)

(73) Assignee: Hitachi, Ltd., Tokyo (JP)

( * ) Notice: Subject to any disclaimer, the term of this patent is extended or adjusted under 35 U.S.C. 154(b) by 808 days.

(21) Appl. No.: 11/842,991

(22) Filed: Aug. 22, 2007

(65) Prior Publication Data

US 2008/0052048 A1 Feb. 28, 2008

(30) Foreign Application Priority Data

Aug. 22, 2006 (JP) ................................ 2006-225242

(51) Int. Cl.
  *G06G 7/48* (2006.01)
(52) U.S. Cl. .......................................................... 703/6
(58) Field of Classification Search ...................... 703/6
  See application file for complete search history.

(56) References Cited

U.S. PATENT DOCUMENTS

| | | | |
|---|---|---|---|
| 6,678,642 B1 * | 1/2004 | Budge ............................... | 703/2 |
| 7,038,700 B2 * | 5/2006 | Kawaguchi et al. ........... | 345/646 |

FOREIGN PATENT DOCUMENTS

| | | |
|---|---|---|
| JP | 2000-352545 | 12/2000 |
| JP | 2003-108609 | 4/2003 |
| JP | 2006-199155 | 8/2006 |

OTHER PUBLICATIONS

Zhao et al.; Interactive Control of Component-based Morphing; Eurographics/SIGGRAPH Symposium on Computer Animation (2003) D. Breen, M. Lin (Editors); pp. 339-348, 385.*
Japanese Office Action mailed Mar. 15, 2011; Application No. 2006-225242; (Partial Translation).

* cited by examiner

*Primary Examiner* — Hugh Jones
(74) *Attorney, Agent, or Firm* — Antonelli, Terry, Stout & Kraus, LLP.

(57) ABSTRACT

An analytical model creation system can create a desired analytical model by adding a given shape change to an existing analytical model. The system includes an adjacent partial analytical model interlocking section for performing an interlocking change process. The interlocking change process is performed on the existing analytical model as a combined analytical model comprising a plurality of partial analytical models. The process assumes any one of the partial analytical models in the combined analytical model to be a change-targeted partial analytical model. The process allows a partial analytical model adjacent to the change-targeted partial analytical model to reflect a shape change given to the change-targeted partial analytical model. The process thereby makes a shape change to the adjacent partial analytical model in interlock with the shape change.

4 Claims, 13 Drawing Sheets

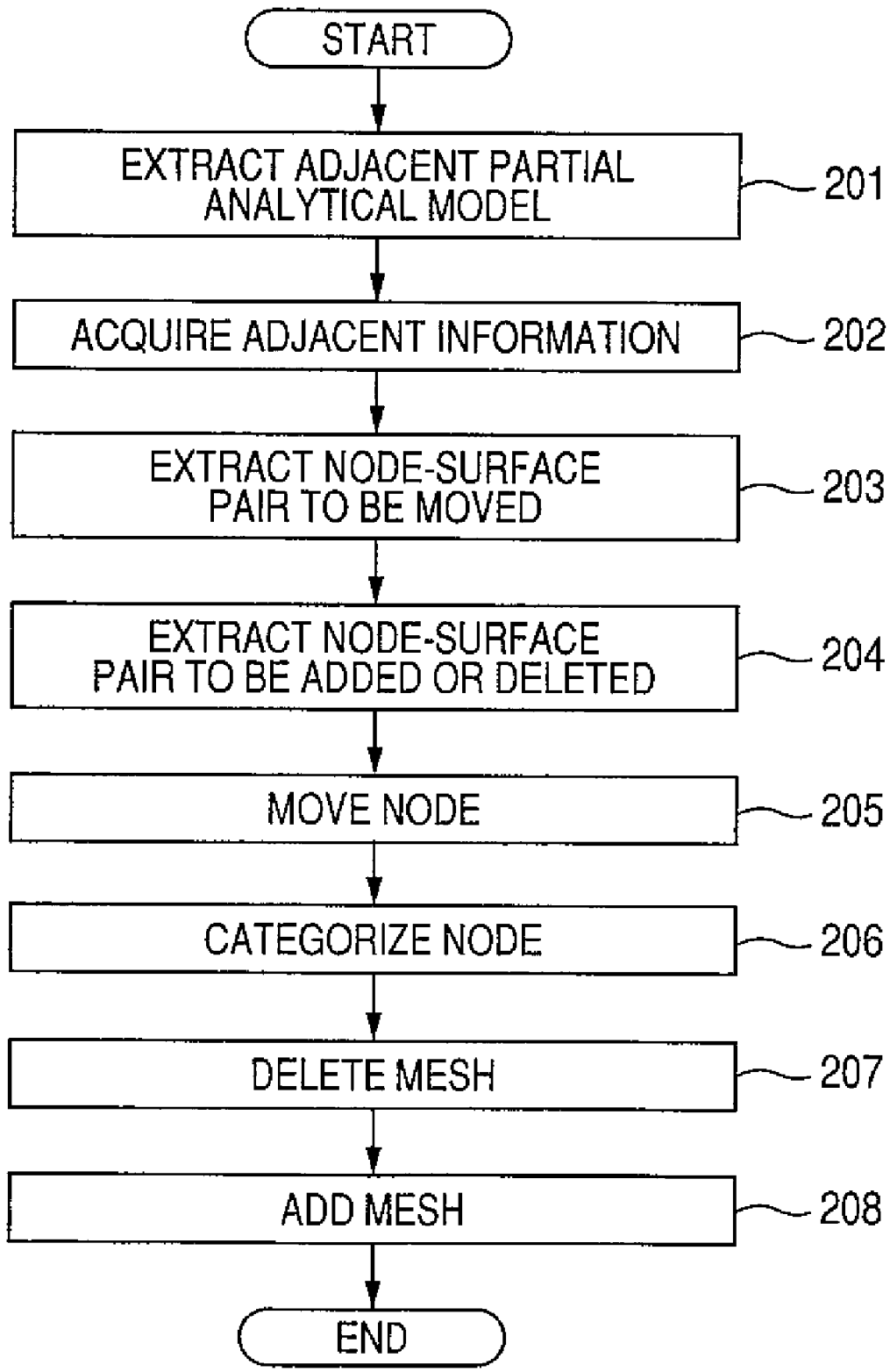

ANALYTICAL MODEL CREATION SYSTEM

CLAIM OF PRIORITY

The present application claims priority from Japanese application serial no. 2006-225242, filed on Aug. 22, 2006, the content of which is hereby incorporated by reference into this application.

FIELD OF THE INVENTION

The invention relates to a CAE system for simulating a physics phenomenon based on numeric analysis using a computer and more particularly to creation of an analytical model in the CAE system.

BACKGROUND OF THE INVENTION

In recent years, a CAE (Computer Aided Engineering) system is extensively used for a product development process to reduce development costs or shorten a design development period. The CAE system (hereafter referred to simply as CAE) creates an analytical model using shape data generated with a CAD (Computer Aided Design) system. The CAE performs analyses such a strength analysis, a fluid analysis, and a vibration analysis by using an analysis technique such as a finite element method or a boundary element method, based on the analytical model.

With respect to analytical model creation in the CAE, there is a known technique that uses an existing analytical model to create a desired analytical model. An example is disclosed in JP-A No. 2003-108609 as "morphing method for structural shape". The "morphing method for structural shape" in JP-A No. 2003-108609 provides multiple reference points for an existing analytical model. The method moves the reference points on the basis of a correspondence relation between the reference points and a mesh model contained in the existing analytical model, and deforms the mesh model of the existing analytical model as moving the reference point, thereby making it possible to create a desired analytical model. The technique using an existing analytical model can eliminate the need for settings such as mesh data creation and a boundary condition and greatly reduce the load of the analytical model creation.

A method referred to an interaction analysis is known in an analysis using an analytical model with the CAE. An example thereof is disclosed in JP-A No. 2000-352545 as "fluid-structure interaction analysis apparatus". When performing an interaction analysis by interacting a fluid analysis and a structural analysis with the "fluid-structure interaction analysis apparatus" of JP-A No. 2000-352545, first obtaining a deformation volume of an object by using the structural analysis, after that, moving nodes corresponding to an analytical model in a space for the fluid analysis by the deformation volume of the object associated with the structural analysis, and obtaining a deformation for each node on the object. In this manner, the apparatus can realize an interaction analysis between the fluid analysis and the structural analysis while interlocking analytical model shapes of the space and the object. Such interaction analysis can provide a fluid analysis in consideration of object deformation.

As mentioned above, the CAE needs to create an analytical model. The analytical model creation requires a large quantity of work, which includes generating mesh data from shape data such as CAD data and then supplying parameters and a boundary condition to each mesh in the mesh data. Accordingly, the CAE is expected to reduce as much workload as possible in the analytical model creation.

In many cases of product development processes using the CAE, an object to be newly analyzed can be obtained by merely adding a partial shape change as miner change to an existing object which has been already analyzed. Therefore, when creating an analytical model of such an object with the partial shape change, the analytical model can be created by merely adding the partial shape change to an existing analytical model which has been already analyzed. For this reason, according to the above-mentioned method (existing analytical model-reusing method) of creating a new analytical model (target analytical model) by reusing the existing analytical model, it is possible to effectively reduce a workload in the analytical model creation. However, when applying the existing analytical model-reusing method to a combined analytical model, there is room for improvement.

Here, the combined analytical model means an analytical means in which multiple partial analytical models are combined into one analytical model and a mesh for each partial analytical model has no continuity in a boundary between adjacent partial analytical models. When the existing analytical model-reusing method is applied to the combined analytical model, it is need to add a shape change individually to each partial analytical model in an existing combined analytical model. Even if the existing analytical model-reusing method can be applied to the combined analytical model, the combined analytical model increases a workload on creating an analytical model and needs to be improved.

The concept of the interaction analysis in JP-A No. 2000-352545 is effective for improving the workload problem in the combined analytical model. When the existing analytical model-reusing method is applied to the combined analytical model, it is often sufficient to make a shape change to one of partial analytical models constituting the combined analytical model. When the concept of the interaction analysis can be applied to such a combined analytical model, a shape change may be made to one of partial analytical models in the existing combined analytical model and may be also reflected on the other partial analytical models. This makes it possible to greatly decrease a workload on creating an analytical model also for the combined analytical model.

The technique in JP-A No. 2000-352545 allows a deformation result obtained by the structural analysis to be reflected on an analytical model in the space for the fluid analysis. The technique is inapplicable to a shape change for examining an optimum product shape during a design process. When the product design process causes a minute shape change, for example, the technique in JP-A No. 2000-352545 can interlock the changed shape between partial analytical models. When a large shape change is made to one partial analytical model such as changing a projection 10 mm long to 50 mm, however, simply moving nodes distorts a mesh and degrades the analysis accuracy. When a design change is made to add or remove a rib or a hole, only moving nodes cannot interlock shapes between partial analytical models. In such case, deforming one partial analytical model needs to be followed by deforming an adjacent partial analytical model.

The present invention has been made in consideration of the foregoing. An object of the present invention is to create a desired analytical model in a laborsaving manner when an existing analytical model is reused to create the targeted combined analytical model.

SUMMARY OF THE INVENTION

To realize the above-mentioned object, the invention is configured to allow a partial analytical model adjacent to one of partial analytical models as a change-targeted partial analytical model in an existing combined analytical model to reflect a shape change made to the change-targeted partial analytical model.

Specifically, an analytical model creation system can create a desired analytical model by adding a given shape change to an existing analytical model. The system includes an adjacent partial analytical model interlocking section for performing an interlocking change process. The interlocking change process is performed on the existing analytical model as a combined analytical model comprising a plurality of partial analytical models. The process assumes any one of the partial analytical models in the combined analytical model to be a change-targeted partial analytical model. The process allows a partial analytical model adjacent to the change-targeted partial analytical model to reflect a shape change given to the change-targeted partial analytical model. The process thereby makes a shape change to the adjacent partial analytical model in interlock with the shape change.

Thus a shape change given to one partial analytical model is reflected so as to be able to interlockingly change another partial analytical model. This makes it possible to greatly reduce workload when creating a desired analytical model by applying the existing analytical model-reusing method to the combined analytical model.

In the analytical model creation system according to the invention, the interlocking change process includes a step of acquiring adjacency information between partial analytical models such as an adjacency relationship between the change-targeted partial analytical model and the adjacent partial analytical model and an adjacency relationship between a changed partial analytical model resulting from adding the shape change to the change-targeted partial analytical model and the adjacent partial analytical model. The process also includes a step of at least one of moving a node for a mesh in the adjacent partial analytical model, deleting a mesh from the adjacent partial analytical model, and adding a mesh to the adjacent partial analytical model based on the adjacency information between partial analytical models.

The interlocking change can be more effective when the adjacency information between partial analytical models is used for interlockingly adding a shape change to an adjacent partial analytical model.

The analytical model creation system according to the embodiment includes the following preferred considerations. A node of a mesh is supposed on a surface of the adjacent partial analytical model and an element surface of a mesh is supposed in the change-targeted partial analytical model or the changed partial analytical model. A matching condition postulates that the element surface contains the node. A set of matching node and element surface is used for the adjacency information between partial analytical models.

The analytical model creation system according to the embodiment also includes the following preferred consideration. A mesh size adjustment process is performed so as to adjust a mesh size for the changed analytical model resulting from the interlocking change process to a mesh size for an analytical model before change.

The present invention can create a desired analytical model in a laborsaving manner when an existing analytical model is reused to create the desired combined analytical model.

BRIEF DESCRIPTION OF THE DRAWINGS

FIG. 7 shows a flow of an interlocking change process for an adjacent partial analytical model;

DETAILED DESCRIPTION OF THE PREFERRED EMBODIMENTS

Figure 1:
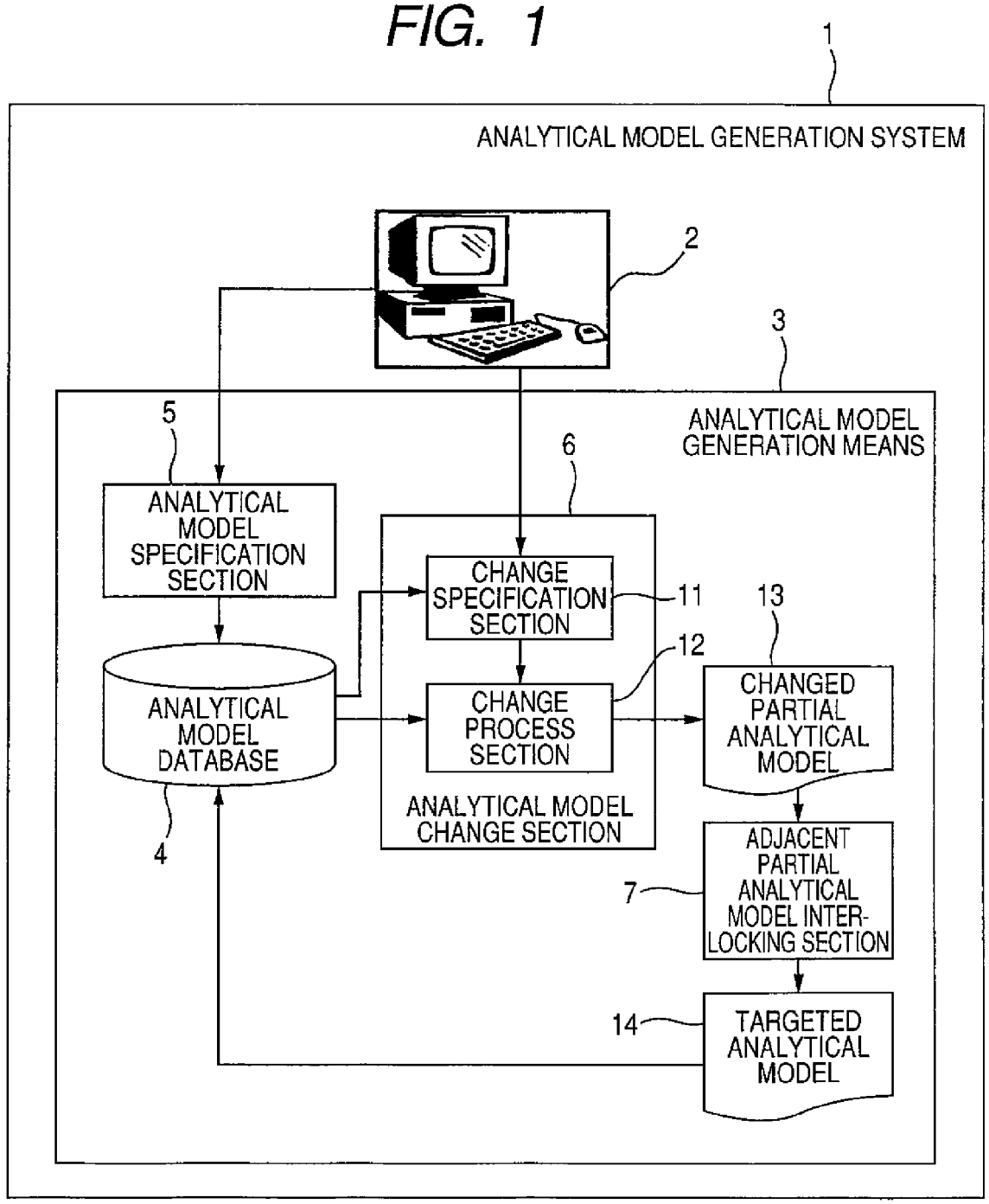
FIG. 1 shows the construction of an analytical model creation system according to an embodiment of the present invention.

Embodiments of the present invention will be described in further detail. FIG. 1 shows the construction of an analytical model creation system according to an embodiment of the present invention. An analytical model creation system 1 has a function to create a desired analytical model by partially changing an existing analytical model. The analytical model creation system 1 includes: a hardware system using a data processing apparatus such as a computer; and a software system (computer program) installed on the hardware system for the desired analytical model creation function using an existing analytical model. The hardware system includes not only the data processing apparatus and a data storage apparatus (not shown) but also an input/output apparatus 2 for a system user to input or display data. The input/output apparatus 2 includes an input device such as a keyboard or a pointing device and an output device such as a display device. Analytical model creation means 3 making a shape change to an existing analytical model is constructed as a computer program. The analytical model creation means 3 includes an analytical model database 4, an analytical model specification section 5, an analytical model change section 6, and an adjacent partial analytical model interlocking section 7. The desired analytical model creation function in the analytical model creation system 1 according to the embodiment basically aims at a combined analytical model. In the description of the embodiment, an "analytical model" signifies a "combined analytical model".

The analytical model database 4 stores an existing analytical model. When an existing analytical model stored in the analytical model database 4 is used to newly create a desired analytical model, the analytical model specification section 5 specifies an existing analytical model as a source of the desired analytical model.

The analytical model change section 6 includes a change specification section 11 and a change processing section 12. The change specification section 11 is used for providing specifications about a shape change needed for acquiring a desired analytical model by adding the shape change to an existing analytical model. The change specification section 11 is configured to perform the following processes: a change-targeted partial analytical model specification process that specifies a targeted partial analytical model to be changed from among partial analytical models constituting a combined analytical model; a change portion specification process that specifies a change portion in the specified change-targeted partial analytical model; and a change condition specification process that specifies a change condition. The change process section 12 performs a change process specified by the change specification section 11. The change process section 12 outputs a changed partial analytical model 13 as a process result.

The adjacent partial analytical model interlocking section 7 performs an interlocking change process for an adjacent partial analytical model. Specifically, the process reflects a change added to a change-targeted partial analytical model, i.e., a shape change added to the changed partial analytical model 13 on an adjacent partial analytical model adjacent to the change-targeted partial analytical model. In this manner, the process provides the adjacent partial analytical model with the shape change interlocked with the shape change made to the change-targeted partial analytical model. The adjacent partial analytical model interlocking section 7 further performs a process of appropriately adjusting a mesh size in each changed partial analytical model. As a result of these processes, the adjacent partial analytical model interlocking section 7 outputs a desired analytical model 14 equivalent to the entire combined analytical model to which the final change is made.

Figure 2:
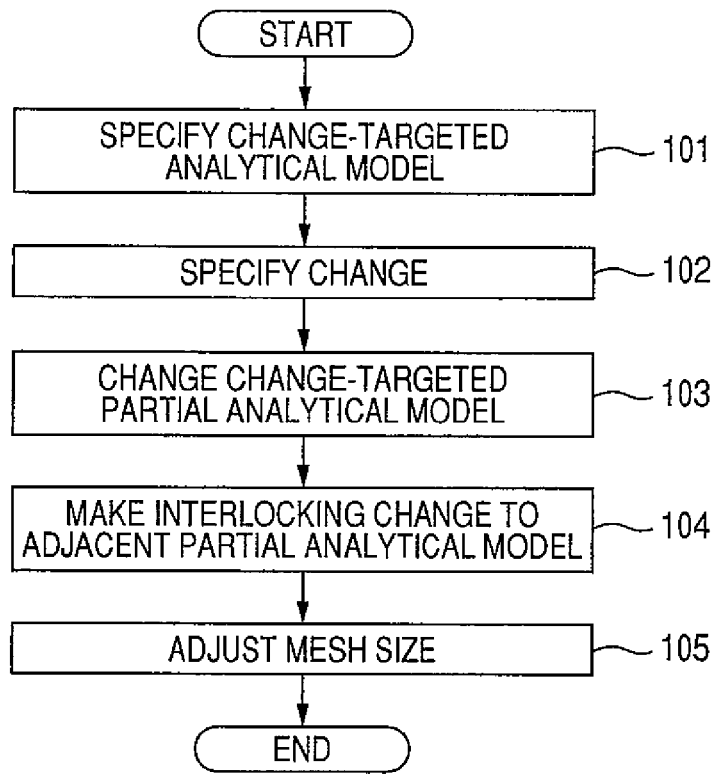
FIG. 2 shows a flow of the analytical model creation process.

The following describes a process performed in the analytical model creation system 1. The analytical model creation system 1 performs the process of creating a desired analytical model using an existing analytical model. As shown in FIG. 2, the analytical model creation process includes the following processes: specifying a change-targeted analytical model (Step 101); specifying a change (Step 102); changing a change-targeted partial analytical model (Step 103); making an interlocking change to an adjacent partial analytical model (Step 104); and adjusting a mesh size (Step 105). These processes will be described below.

Figure 3:
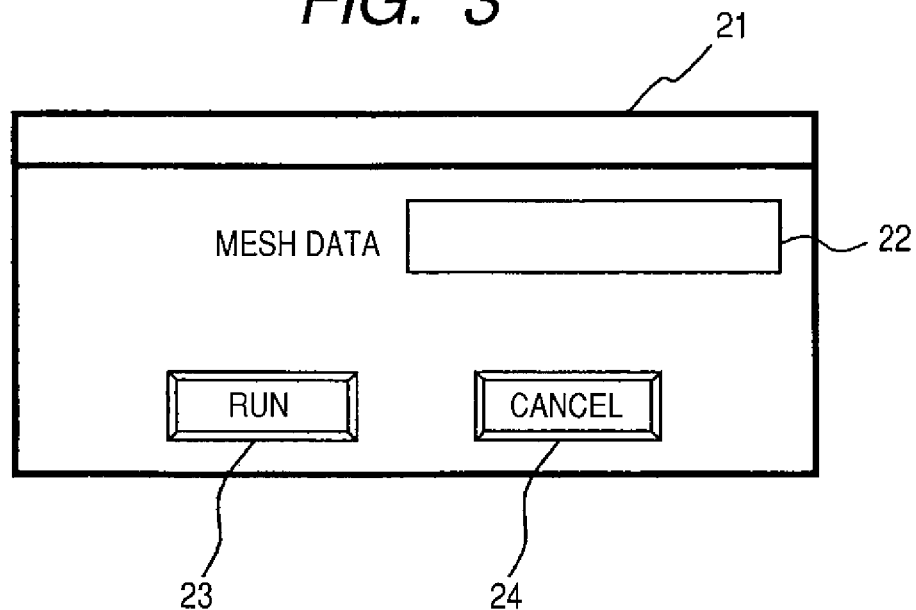
FIG. 3 shows an operation screen example for specifying a change-targeted analytical model.

The process of specifying a change-targeted analytical model (Step 101) is performed when an operation screen 21 is displayed by the analytical model specification section 5 as shown in FIG. 3 on the display device. The operation screen 21 includes an analytical model specification field 22, a run button 23, and a cancel button 24. The change-targeted analytical model signifies as a source of a desired analytical model. A user inputs a file name for the change-targeted analytical model in the analytical model specification field 22. Pressing the run button 23 confirms the input. The specified analytical model is stored in the analytical model database 4 corresponding to the file name inputted in the analytical model specification field 22. When the run button 23 is pressed, the specified analytical model is registered as the change-targeted analytical model. Pressing the cancel button 24 cancels the input to the analytical model specification field 22.

The change specification section 11 is used for the process of specifying a change (Step 102). The change specification process specifies a partial analytical model to be changed for the change-targeted analytical model specified at Step 101. The process also specifies a change portion and a change condition for the specified change-targeted partial analytical model. The change condition includes a change method and a change content. There are various types of change methods that can be selected as appropriate. The embodiment allows the use of three change methods: a free form deformation method; a parametric mesh deformation method; and a feature addition/deletion method. A display of the operation screen changes according to these change methods. The change method can be specified by selecting the operation screen. The selected operation screen can be used to specify a change content, a change-targeted partial analytical model, and a change portion. The following describes the change specification process corresponding to each of the change methods.

The free form deformation method specifies a movement control node, a movable node, and a fixed node for each mesh in the analytical model. Further, the free form deformation method specifies a movement vector and a distance (or a rotation axis and a rotation angle) for a movement control node. The movement control node moves by a specified movement vector and distance (or rotation angle). The fixed node does not move. The movable node moves so as to interpolate between the movement control node and the fixed node. Namely, the free form deformation method allows the movement control node to translate or rotate based on the specified movement vector and distance or the specified rotation axis and rotation angle. In addition, the free form deformation method makes a partial shape change to an analytical model by allowing the movable node to interpolatively move in accordance with the movement of movement control node. According to the free form deformation method, specifying a node movement attribute also specifies a change portion.

FIGS. 4A to 4D show an example of the operation screen for the free form deformation method. An operation screen 31 includes an analytical model display area 32 and an operation tool display area 33.

The analytical model display area 32 displays an analytical model 34 specified as a change target at Step 101. The analytical model 34 in FIGS. 4A to 4D is illustrated as a combined analytical model containing partial analytical models 34a and 34b. A change-targeted partial analytical model can be specified by clicking on the partial analytical model 34a or 34b of the analytical model 34, for example. FIGS. 4A to 4D show that the partial analytical model 34a is specified as a change-targeted partial analytical model.

The operation tool display area 33 is provided with a movement control node specification button 35, a movable node specification button 36, and a fixed node specification button 37 for specifying a node movement attribute. A translation button 38 and a rotation button 39 are provided for selecting a node movement type. A movement vector/rotation axis specification field 40 is provided for specifying a movement vector or a rotation axis. A distance/rotation angle specification field 41 is provided for specifying a distance or a rotation angle. These tools are used to specify a change content.

A node movement attribute is specified in order to specify a change content by using the operation screen 31. A node movement attribute can be specified by selecting one of the buttons 35 through 37 and clicking on a node in a mesh for the analytical model 34. While the movement control node specification button 35 is selected, for example, clicking on any node of the analytical model 34 can specify that node as a movement control node. After the node movement attribute is specified, the node movement type then is specified. This can be done by selecting the translation button 38 or the rotation button 39. After the node movement type is specified, a movement vector or a rotation axis is specified in the movement vector/rotation axis specification field 40. Further, a distance or a rotation angle is specified in the distance/rotation angle specification field 41.

The parametric mesh deformation method recognizes a geometric feature of the analytical model's outer surface by using geometric feature recognition means (not shown) provided for the change specification section 11. The method specifies a change portion according to the recognized geometric feature. The method specifies a change of a geometric parameter for the specified geometric feature. The method moves a specific node so as to adjust to the changed geometric parameter. Specifically, the method moves anode (specific node) associated with the geometric feature. In this manner, the method makes a partial shape change to the analytical model. Accordingly, the parametric mesh deformation method selects a change portion in the recognized geometric feature to specify the change portion. The geometric feature signifies geometric element surfaces such as plain, cylindrical, conic, spheric, torus, and free-form surfaces. The geometric feature also signifies a feature shape resulting from a combination of these element surfaces.

Figure 4A:
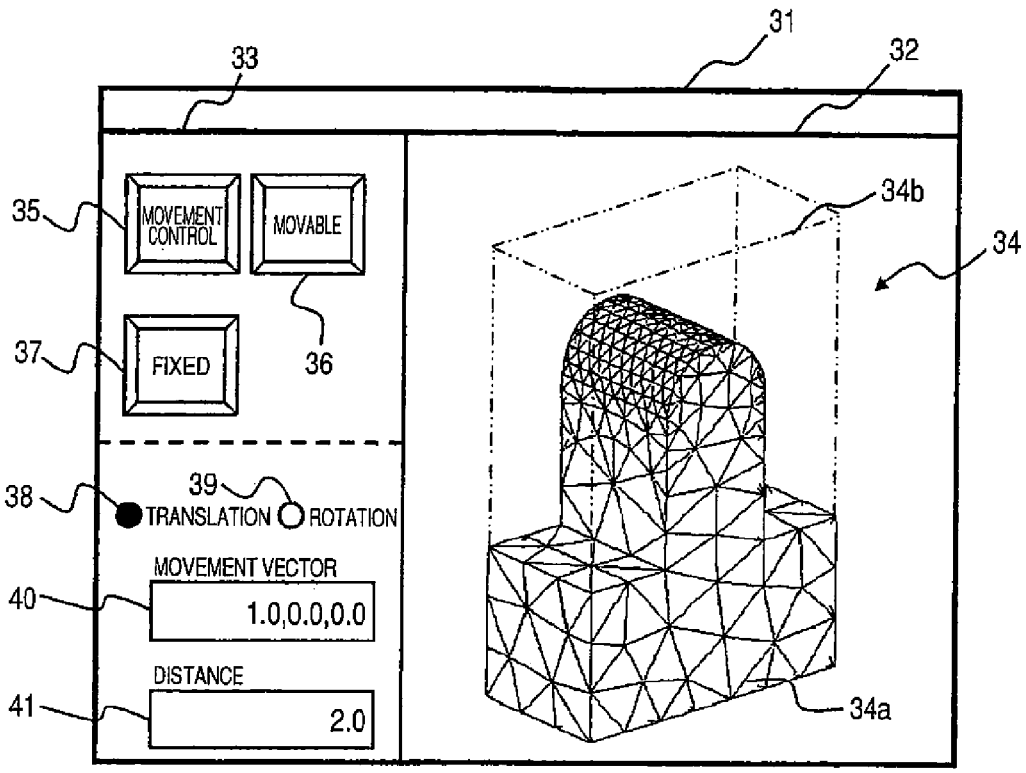
FIGS. 4A to 4D show an operation screen example for the free form deformation method.
Figure 4B:
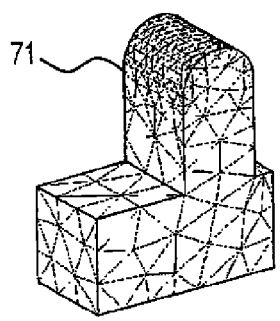
Figure 4C:
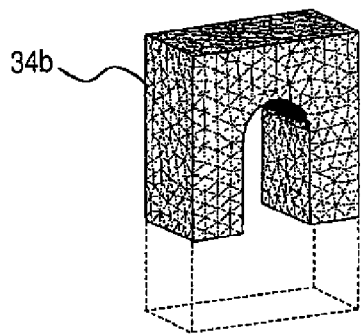
Figure 4D:
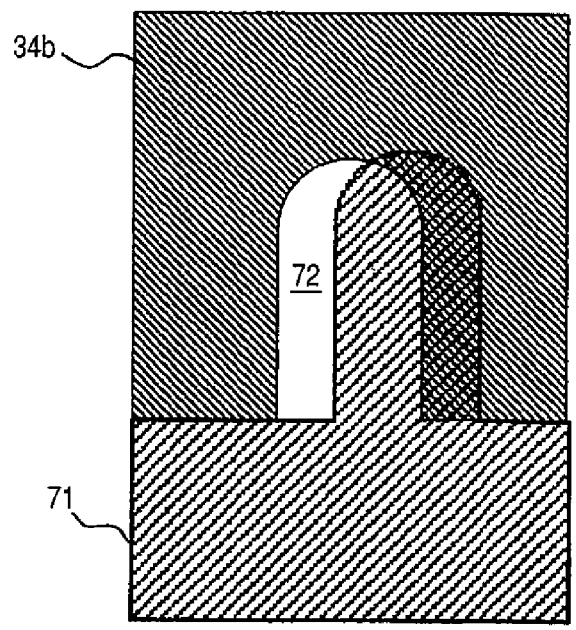
Figure 5A:
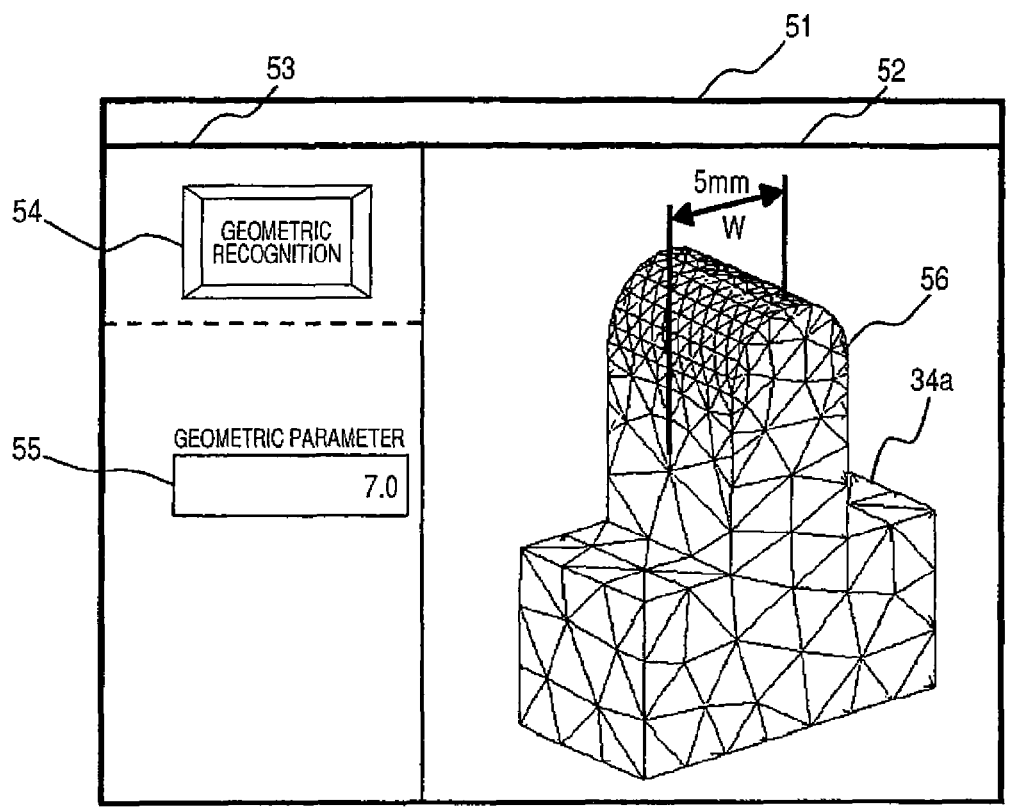
FIGS. 5A and 5B show an operation screen example for the parametric mesh deformation method.
Figure 5B:
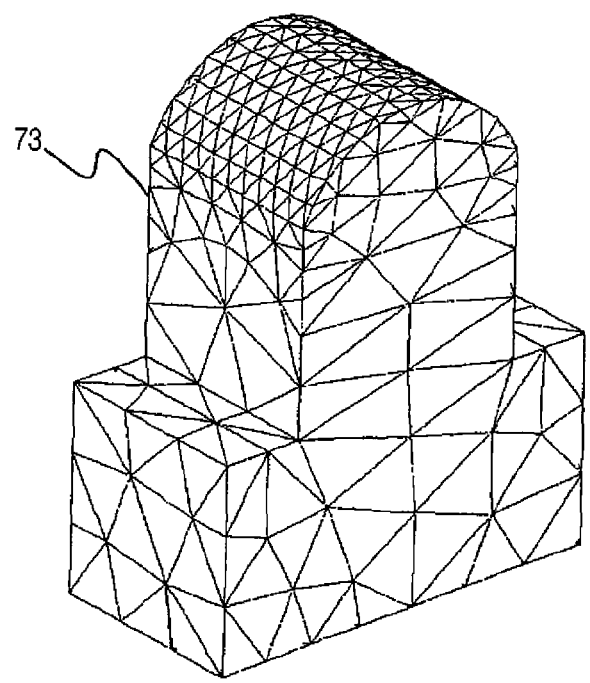

FIGS. 5A and 5B show an example of the operation screen for the parametric mesh deformation method. Similarly to the operation screen 31, the operation screen 51 includes an analytical model display area 52 and an operation tool display area 53. The analytical model display area 52 is similar to the analytical model display area 32 in FIGS. 4A to 4D and displays an analytical model specified as a change target at Step 101. In FIGS. 5A and 5B, however, the area shows only the partial analytical model 34a specified as a change-targeted partial analytical model. The operation tool display area 53 includes a geometric recognition button 54 and a geometric parameter specification field 55.

When the operation screen 51 is used to specify a change content, a geometric feature for the partial analytical model 34a is recognized. Selecting the geometric recognition button 54 is needed to recognize a geometric feature. After the geometric feature is recognized, a geometric feature for change is specified based on the recognized geometric feature. This can be done by clicking on an intended geometric feature in the partial analytical model 34a. According to the example in FIGS. 5A and 5B, a protrusion 56 is specified as the geometric feature. After the geometric feature is specified, a change for geometric parameter is specified in the geometric parameter specification field 55. FIGS. 5A and 5B show an example of changing distance W between plain surfaces as a geometric parameter from 5 mm to 7 mm for the partial analytical model 34a.

The feature addition/deletion method makes a partial shape change to the analytical model by adding or deleting a feature shape. To add a feature shape, the method generates a mesh model for a feature shape to be added to a change-targeted partial analytical model. The method then performs a set operation on meshes for the feature shape and the change-targeted partial analytical model to integrate the feature shape with the change-targeted partial analytical model. To delete a feature shape, the method selects a feature shape of an area to be deleted from a change-targeted partial analytical model. The method deletes a mesh contained in the area to be deleted.

Figure 6A:
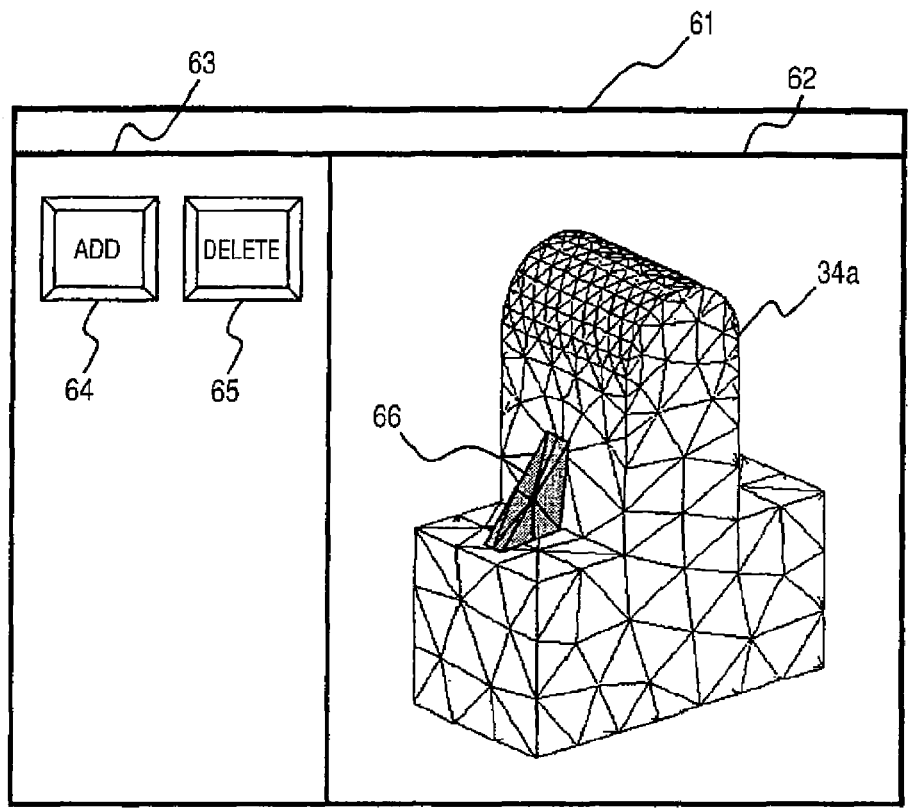
FIGS. 6A and 6B show an operation screen example for the feature addition/deletion method.

FIG. 6A shows an example of the operation screen for the feature addition/deletion method. Similarly to the operation screen 31, the operation screen 61 includes an analytical model display area 62 and an operation tool display area 63. The analytical model display area 62 is similar to the analytical model display area 52 in FIGS. 5A and 5B and displays only the partial analytical model 34a specified as the change-targeted partial analytical model. The operation tool display area 63 includes an addition button 64 and a deletion button 65.

The operation screen 61 is used to make a change such as adding or deleting a feature shape for the partial analytical model 34a. Namely, to add a feature shape, a feature shape mesh model 66 is created so as to be added to the partial analytical model 34a, and then the addition button 64 is selected. To delete a feature shape, it is specified so as to be deleted for the partial analytical model 34a, and then the deletion button 65 is selected.

As shown in FIG. 2, the change process section 12 is used to change a change-targeted partial analytical model (Step 103). The change process depends on the above-mentioned change methods such as the free form deformation, the parametric mesh deformation, and the feature addition/deletion. The change process will be described below corresponding to the change methods.

When the free form deformation method is used, the change process section 12 moves a node in the mesh for the change-targeted analytical model in accordance with the specified change content as mentioned above. In this manner, a shape change is made to the change-targeted partial analytical model. According to the example in FIGS. 4A to 4D, the node movement attribute is specified so that the protrusion 56 moves to the right direction with reference to the partial analytical model 34a. The movement type is set to translation. When assuming that the movement vector is set to (1,0,0) and the distance is set to 2 mm, under these condition, the change process section 12 moves nodes of the mesh in the partial analytical model 34a. As a result, a changed partial analytical model 71 is obtained as shown in FIG. 4B. At this time, the change is made to only the partial analytical model 34a. In this case, there is misalignment having a gap 72 as shown in FIG. 4D between the changed partial analytical model 71 and the adjacent partial analytical model 34b. As will be described later, the adjacent partial analytical model interlocking section 7 performs an interlocking process to solve the misalignment between the changed partial analytical model 71 and the partial analytical model 34b.

When the parametric mesh deformation method is used, the change process section 12 moves nodes of the mesh in a change-targeted analytical model in accordance with a geometric feature and its geometric parameter specified as the change content as mentioned above. In this manner, a shape change is made to the change-targeted partial analytical model. According to the example in FIGS. 5A and 5B, the protrusion 56 is specified as a geometric feature. Its geometric parameter, i.e., distance W between plain surfaces, is changed from 5 mm to 7 mm. The change process section 12 obtains a changed partial analytical model 73 as shown in FIG. 5B.

Figure 6B:
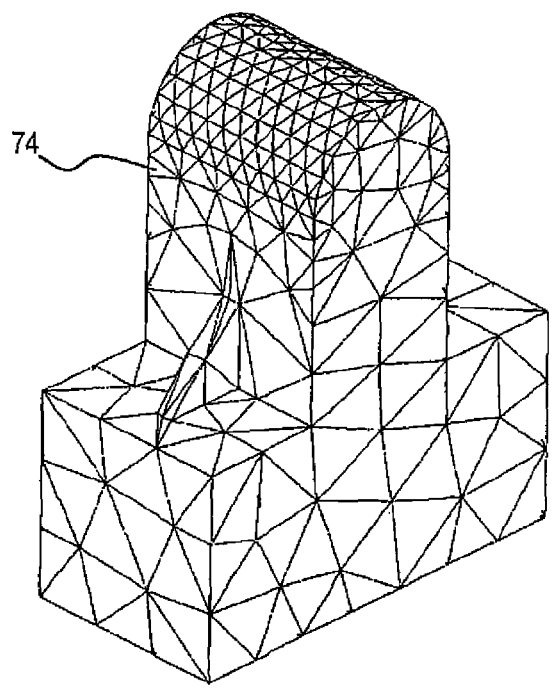

When the feature addition/deletion method is used, a feature shape is specified as the change content so as to be added or deleted in the change-targeted partial analytical model as mentioned above. The change process section 12 accordingly performs the set operation on a mesh to add the feature shape to the change-targeted partial analytical model or delete the mesh corresponding to the feature shape to be deleted. In this manner, a shape change is made to the change-targeted partial analytical model. The example in FIGS. 6A and 6B generate a feature shape 66 on the partial analytical model 34a. As a result, a changed partial analytical model 74 is created as shown in FIG. 6B.

As shown in FIG. 2, the adjacent partial analytical model interlocking section 7 is used to perform the interlocking change process (Step 104) for an adjacent partial analytical model. The interlocking process reflects the shape change generated to the changed partial analytical model on an adjacent partial analytical model. In this manner, the process provides the adjacent partial analytical model with a shape change interlocked with the shape change generated to the change-targeted partial analytical model. As shown in FIG. 7, the interlocking process includes processes such as extracting an adjacent partial analytical model (Step 201), acquiring adjacent information (Step 202), extracting a node-element surface pair to be moved (Step 203), extracting a node-element surface pair to be added or deleted (Step 204), moving a node (Step 205), categorizing a node (Step 206), deleting a mesh (Step 207), and adding a mesh (Step 208). These processes will be described below.

The process of extracting an adjacent partial analytical model (Step 201) extracts an adjacent partial analytical model that is adjacent to the changed partial analytical model resulting from the change process at Step 103.

The process of acquiring adjacent information (Step 202) acquires adjacency information between partial analytical models. The adjacency information relates to adjacency relationship between a change-targeted partial analytical model and an adjacent partial analytical model or adjacency relationship between a changed partial analytical model and an adjacent partial analytical model. The adjacency information between partial analytical models uses a node-element surface pair, i.e., a pair of a node and an element surface in a mesh for the analytical model. When a change-targeted partial analytical model and an adjacent partial analytical model are used, for example, the process determines a matching set of a node and an element surface out of nodes on the surface of the adjacent partial analytical model and element surfaces of the change-targeted partial analytical model. The process acquires a set of node-element surface pairs as adjacency information between partial analytical models before change (hereafter referred to as adjacency information before change). When an adjacent partial analytical model and a changed partial analytical model are used, the process similarly acquires a set of node-element surface pairs as adjacency information between partial analytical models after change (hereafter referred to as adjacency information after change). A match between the node and the element surface signifies that, when node n exists on element surface f, element surface f matches node n.

The process of extracting a node-element surface pair to be moved (Step 203) extracts a node-element surface pair for a node to be moved from the adjacency information before change and the adjacency information after change acquired at Step 202. Specifically, a given node-element surface pair is contained in the set of node-element surface pairs belonging to the adjacency information before change, but is not contained in the set of node-element surface pairs belonging to the adjacency information after change. The process extracts such node-element surface pair as a node to be moved with reference to the adjacent partial analytical model.

The process of extracting a node-element surface pair to be added or deleted (Step 204) extracts anode-element surface pair to be added or deleted from the adjacency information before change acquired at Step 202. That node-element surface pair is characterized by the fact that its node or element surface is contained in a set of node-element surface pairs associated with the adjacency information before change and disappears from a surface (boundary surface) of the changed partial analytical model.

The process of moving a node (Step 205) moves a node in the node-element surface pair to be moved with reference to an adjacent partial analytical model. Specifically, the process extracts an element surface in the node-element surface pair to be moved from the changed partial analytical model. The process moves a node in the node-element surface pair to be moved on the extracted element surface with reference to an adjacent partial analytical model.

The process of categorizing a node (Step 206) categorizes nodes of an adjacent partial analytical model into two types of internal and external nodes, wherein the nodes of the adjacent partial analytical model is contained in a node belonging to the node-element surface pair to be added or deleted acquired at Step 204. Here, the internal node is located inside the deformed partial analytical model. The presence of an internal node signifies that an adjacent partial analytical model interferes with the deformed partial analytical model. The external node is located outside the deformed partial analytical model. The presence of an external node signifies that a gap exists between the deformed partial analytical model and an adjacent partial analytical model.

The process of deleting a mesh (Step 207) performs a mesh subtraction on a portion interfered by the internal node so as to subtract the deformed partial analytical model from the adjacent partial analytical model. Namely the process means the following expression: (an adjacent partial analytical model to be changed in interlock concerning the internal node)=(the adjacent partial analytical model)−(the changed partial analytical model).

The process of adding a mesh (Step 208) adds a mesh to a gap caused by the external node. Specifically, the process recognizes a closed area formed by an element surface group containing the external node and the surface of the deformed partial analytical model; the process generates a mesh for the closed area and performs a mesh addition operation where the closed area mesh is added to an adjacent partial analytical model. The process means the following expression: (an adjacent partial analytical model to be changed in interlock concerning the internal node)=(the adjacent partial analytical model)+(the closed area mesh).

As shown in FIG. 2, the adjacent partial analytical model interlocking section 7 is used to adjust a mesh size (Step 105). When the mesh size differs before and after a change in the changed partial analytical model or the adjacent partial analytical model interlockingly changed by the interlocking process, the mesh size adjustment process adjusts the changed mesh size to that before the change. To be more specific, when the changed mesh size is greater than that before the change, the process inserts a node into an element having an increased volume. The process divides the element including surrounding elements. This process is repeated until the changed mesh size becomes almost equal to that before the change. In contrast to that, when the changed mesh size is smaller than that before the change, the process contract one element edge of an element having an decreased volume to a point. This process is repeated until the changed mesh size becomes almost equal to that before the change.

These processes are performed to obtain a desired analytical model 34 (FIGS. 4A to 4D) to the entire combined analytical model to which the final change is made. The resulting analytical model 34 is stored as an existing analytical model in the analytical model database 4.

The following describes examples of using the analytical model creation system 1 to obtain a desired analytical model by generating a shape change to an existing analytical model. While an analytical model is generally three-dimensional, the following description assumes an analytical model to be two-dimensional for ease of explanation.

Figure 8:
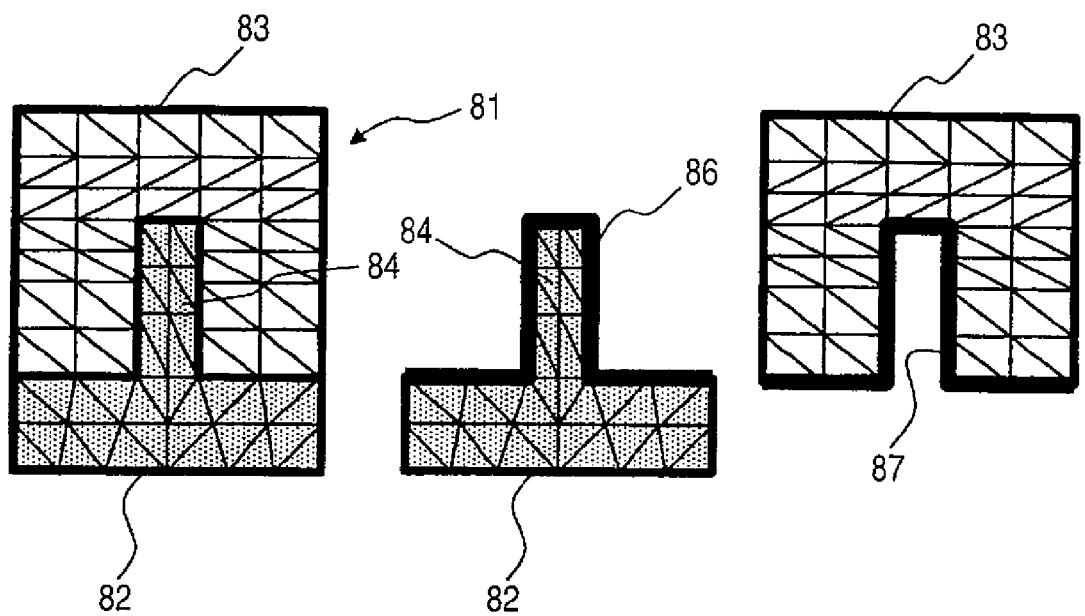
FIG. 8 shows an analytical model to be changed in analytical model creation example 1.
Figure 9:
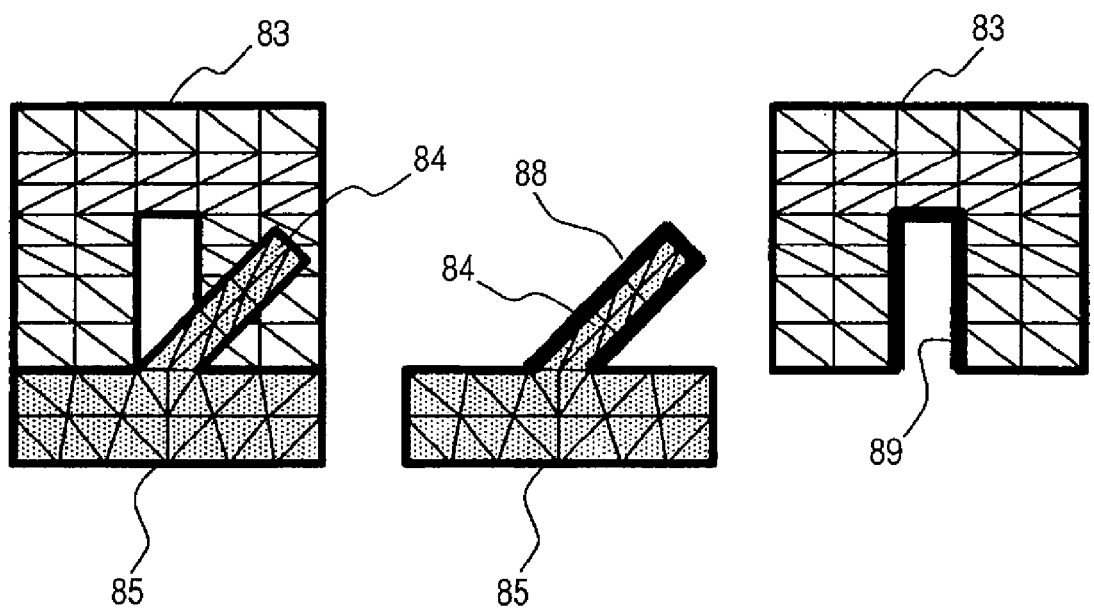
FIG. 9 shows a changed partial analytical model generated by making a shape change to a change-targeted partial analytical model in the analytical model in FIG. 8.

Example 1 of Using the Analytical Model Creation System 1 to Create an Analytical Model The example makes a shape change to an analytical model 81 in FIG. 8. The analytical model 81 contains a partial analytical model 82 and a partial analytical model 83. When assuming that the partial analytical model 82 is to be changed in the analytical model 81 and a shape change is made to the partial analytical model 82 so as to tilt a protruded element 84 by 45 degrees to the right. In this case, for example, the free form deformation method is used to make a shape change for the change-targeted partial analytical model 82. As shown in FIG. 9, the change-targeted partial analytical model 82 consequently becomes a changed partial analytical model 85 with the protruded element 84 tilted by 45 degrees to the right. The partial analytical model 83 adjacent to the changed partial analytical model 85 is unchanged. At this time, the changed partial analytical model 85 is not aligned to the adjacent partial analytical model 83. To solve the misalignment, the interlocking process is performed to reflect the shape change (the 45-degree rightward tilt of the protruded element 84) made to the changed partial analytical model 85 on the adjacent partial analytical model 83.

The interlocking process acquires the adjacency information before change, i.e., adjacency information about the change-targeted partial analytical model 82 and the adjacent partial analytical model 83. The process also acquires the adjacency information after change, i.e., adjacency information about the changed partial analytical model 85 and the adjacent partial analytical model 83. In FIG. 8, element surfaces along a thick line 86 provided for the change-targeted partial analytical model 82 match nodes along a thick line 87 provided for the adjacent partial analytical model 83. The adjacency information before change is therefore acquired as a set of those node-element surface pairs. In FIG. 9, however, element surfaces along a thick line 88 provided for the changed partial analytical model 85 do not match nodes along a thick line 89 provided along the adjacent partial analytical model 83. The adjacency information after change is therefore acquired as a set of node-element surface pairs except those nodes and element surfaces.

After acquiring the adjacency information, the process extracts a node-element surface pair containing a node to be moved with reference to the adjacent partial analytical model 83. The process extracts a node-element surface pair that is contained in a set of node-element surface pairs for the adjacency information before change but is not contained in a set of node-element surface pairs for the adjacency information after change. In the example of FIG. 9, the process extracts a node-element surface pair corresponding to each element surface along the thick line 88 so that the node-element surface pair is to be moved.

After extracting the node-element surface pair to be moved, the process moves the node in the node-element surface pair with reference to the adjacent partial analytical model 83. Specifically, the process moves the node (along the thick line 89) in the adjacent partial analytical model 83 so as to match the element surface (along the thick line 88) pairing with the node according to the adjacency information before change.

Figure 10:
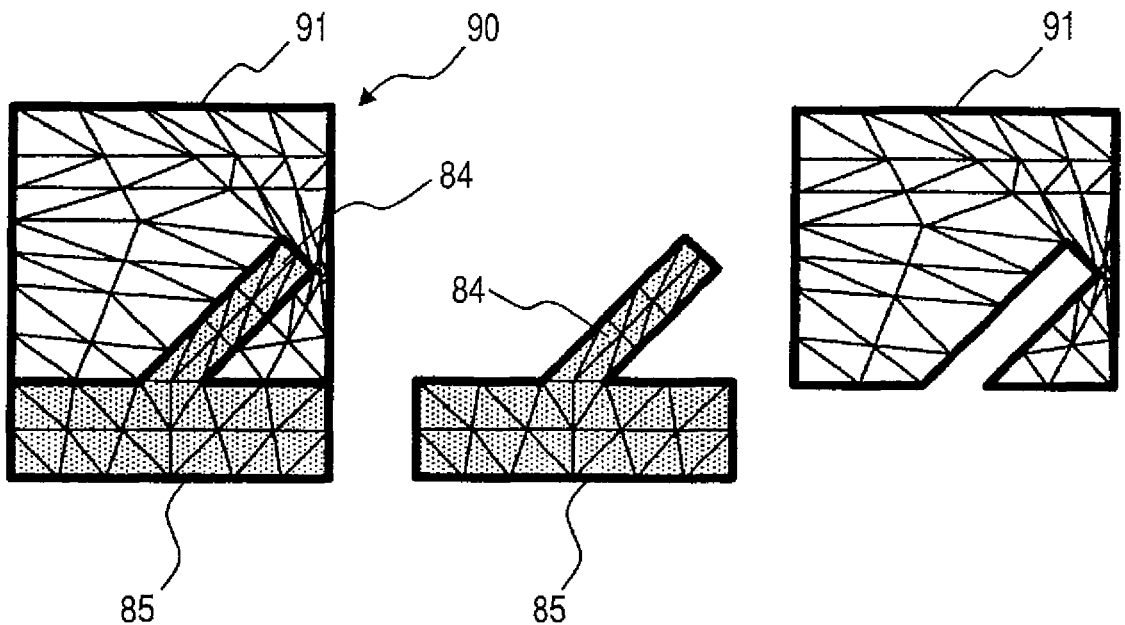
FIG. 10 shows a changed analytical model generated by making a shape change to an adjacent partial analytical model in interlock with the changed partial analytical model in FIG. 9.

The above-mentioned interlocking process creates a changed analytical model 90 as shown in FIG. 10. The changed analytical model 90 contains the changed partial analytical model 85 and a changed adjacent partial analytical model 91. The changed adjacent partial analytical model 91 reflects the shape change in the changed partial analytical model 85, i.e., the 45-degree rightward tilt of the protruded element 84. The changed analytical model 90 maintains the consistency as a whole.

Figure 11:
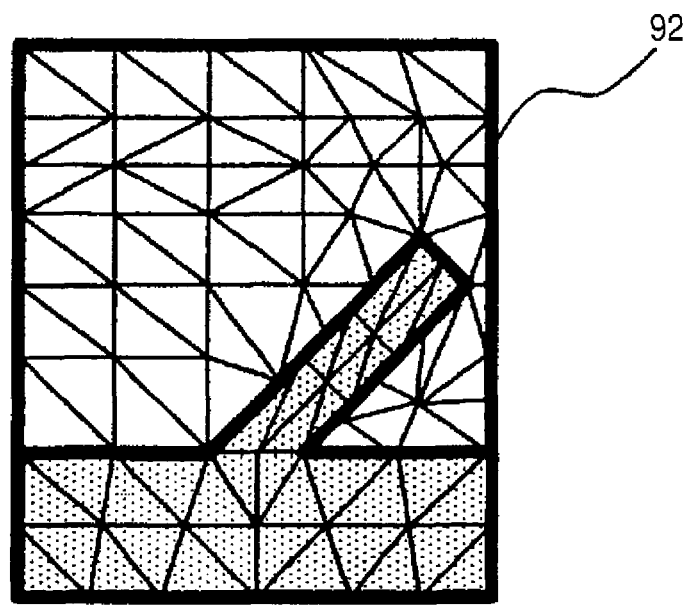
FIG. 11 shows a desired analytical model finally generated from desired analytical model creation example 1.

After the shape change is generated to the analytical model 81, the changed analytical model 90 in FIG. 10 contains larger or smaller meshes than those of the analytical model 81 in FIG. 8. In this case, the mesh size needs to be adjusted. When a mesh is enlarged, the process inserts a node into an element having an increased volume to divide the element. This process is repeated until the changed mesh size becomes almost equal to that before the change. When a mesh is reduced, the process contracts one element edge of an element having a decreased volume to a point. This process is repeated until the changed mesh size becomes almost equal to that before the change. Adjusting mesh sizes finally yields a desired analytical model 92 as shown in FIG. 11.

Figure 12:
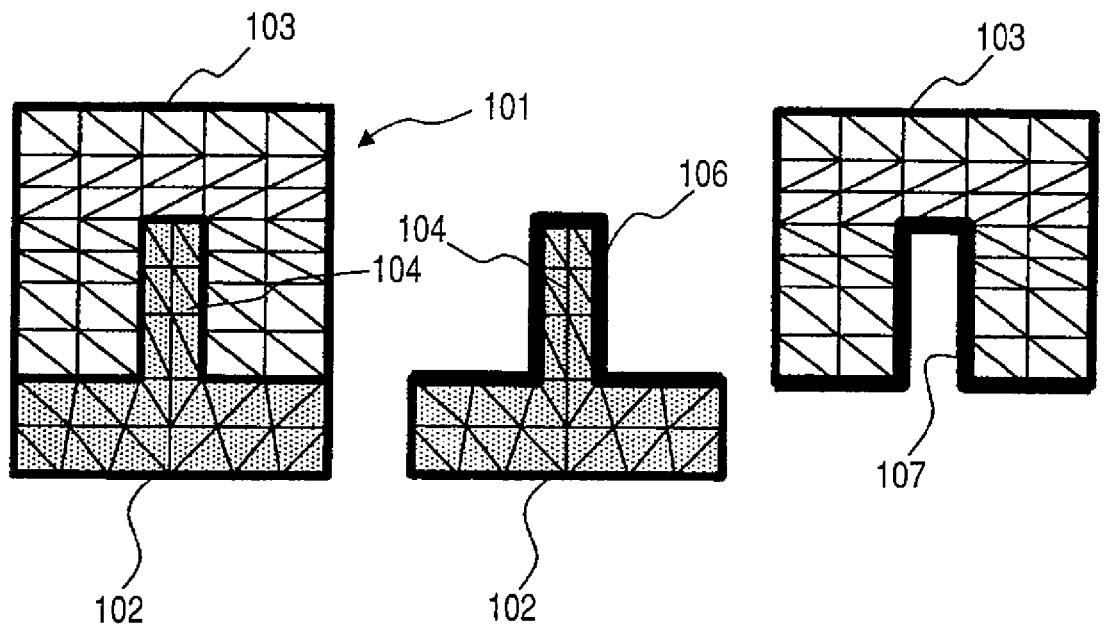
FIG. 12 shows an analytical model to be changed in analytical model creation example 2.
Figure 13:
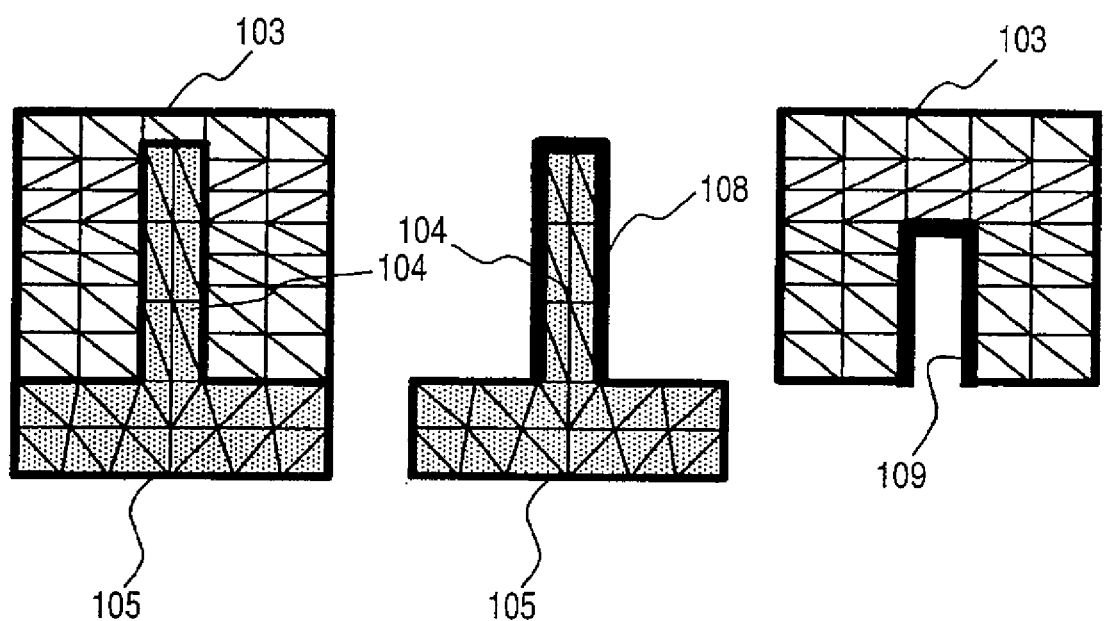
FIG. 13 shows a changed partial analytical model generated by making a shape change to a change-targeted partial analytical model in the analytical model in FIG. 12.

Example 2 of Using the Analytical Model Creation System 1 to Obtain an Analytical Model The example makes a shape change to an analytical model 101 in FIG. 12. The analytical model 101 contains a partial analytical model 102 and a partial analytical model 103. When assuming that the partial analytical model 102 is to be changed in the analytical model 101 and a shape change is made so as to elongate a protruded element 104 of the partial analytical model 102 from 20 mm to 30 mm. In this case, for example, the parametric mesh deformation method is used to make a shape change to the change-targeted partial analytical model 102. As shown in FIG. 13, the change-targeted partial analytical model 102 consequently becomes a changed partial analytical model 105 with the protruded element 104 elongated to 30 mm. The partial analytical model 103 adjacent to the changed partial analytical model 105 is unchanged. At this time, the changed partial analytical model 105 is not aligned to the adjacent partial analytical model 103. To solve the misalignment, the interlocking process is performed to reflect the shape change (elongation of the protruded element 104) made to the changed partial analytical model 105 on the adjacent partial analytical model 103.

The interlocking process acquires the adjacency information before change, i.e., adjacency information about the change-targeted partial analytical model 102 and the adjacent partial analytical model 103. The process also acquires the adjacency information after change, i.e., adjacency information about the changed partial analytical model 105 and the adjacent partial analytical model 103. In FIG. 12, element surfaces along a thick line 106 provided for the change-targeted partial analytical model 102 match nodes along a thick line 107 provided for the adjacent partial analytical model 103. The adjacency information before change is therefore acquired as a set of those node-element surface pairs. In FIG. 13, however, element surfaces along a thick line 108 provided for the changed partial analytical model 105 do not match nodes along a thick line 109 provided along the adjacent partial analytical model 103. The adjacency information after change is therefore acquired as a set of node-element surface pairs except those nodes and element surfaces.

After acquiring the adjacency information, the process extracts a node-element surface pair containing a node to be moved with reference to the adjacent partial analytical model 103. The process extracts a node-element surface pair that is contained in a set of node-element surface pairs for the adjacency information before change but is not contained in a set of node-element surface pairs for the adjacency information after change. In the example of FIG. 13, the process extracts a node-element surface pair corresponding to each element surface along the thick line 108 so that the node-element surface pair is to be moved.

After extracting the node-element surface pair to be moved, the process moves the node in the node-element surface pair with reference to the adjacent partial analytical model 103. Specifically, the process moves the node (along the thick line 109) in the adjacent partial analytical model 103 so as to match the element surface (along the thick line 108) pairing with the node according to the adjacency information before change.

Figure 14:
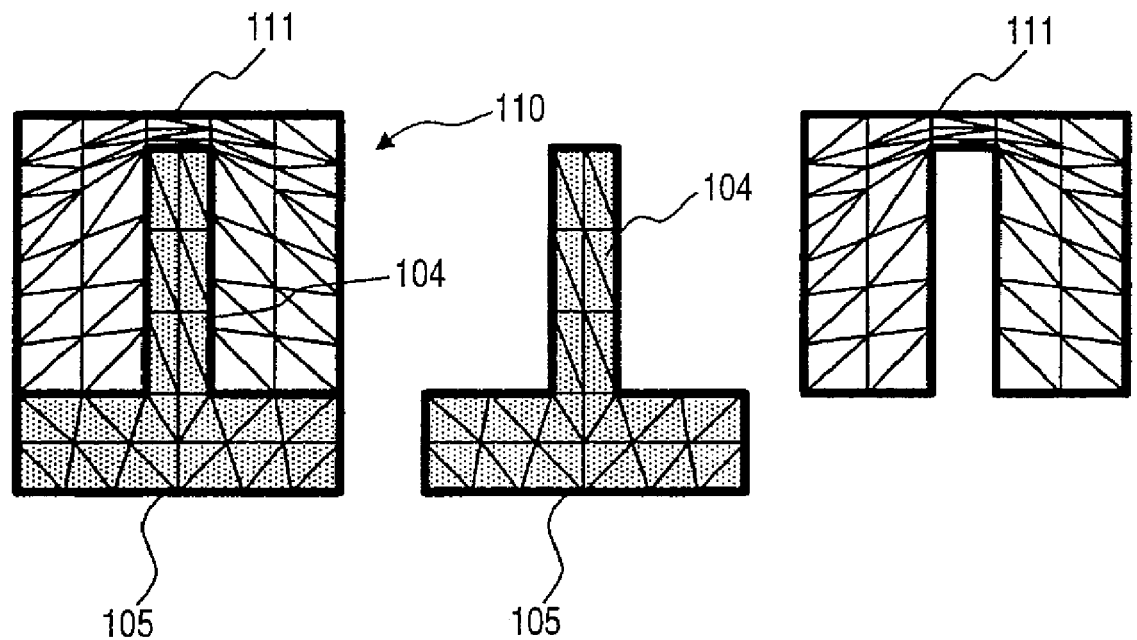
FIG. 14 shows a changed analytical model generated by making a shape change to an adjacent partial analytical model in interlock with the changed partial analytical model in FIG. 13.

The above-mentioned interlocking process creates a changed analytical model 110 as shown in FIG. 14. The changed analytical model 110 contains the changed partial analytical model 105 and a changed adjacent partial analytical model 111. The changed adjacent partial analytical model 111 reflects the shape change in the changed partial analytical model 105, i.e., elongating the protruded element 104 ten millimeters. The changed analytical model 110 maintains the consistency as a whole.

Figure 15:
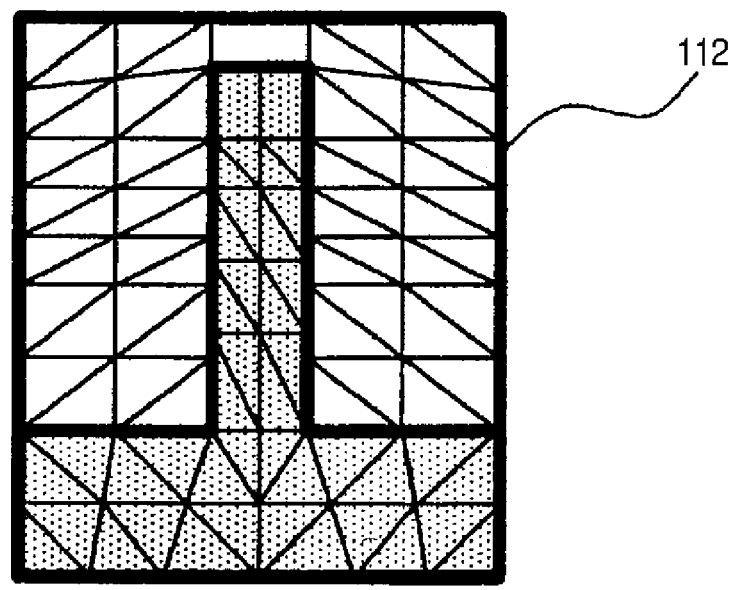
FIG. 15 shows a desired analytical model finally generated from desired analytical model creation example 2.

After the shape change is made to the analytical model 101, the changed analytical model 110 in FIG. 14 contains larger or smaller meshes than those of the analytical model 101. In this case, the mesh size needs to be adjusted as mentioned in example 1. Adjusting mesh sizes finally yields a desired analytical model 112 as shown in FIG. 15.

Figure 16:
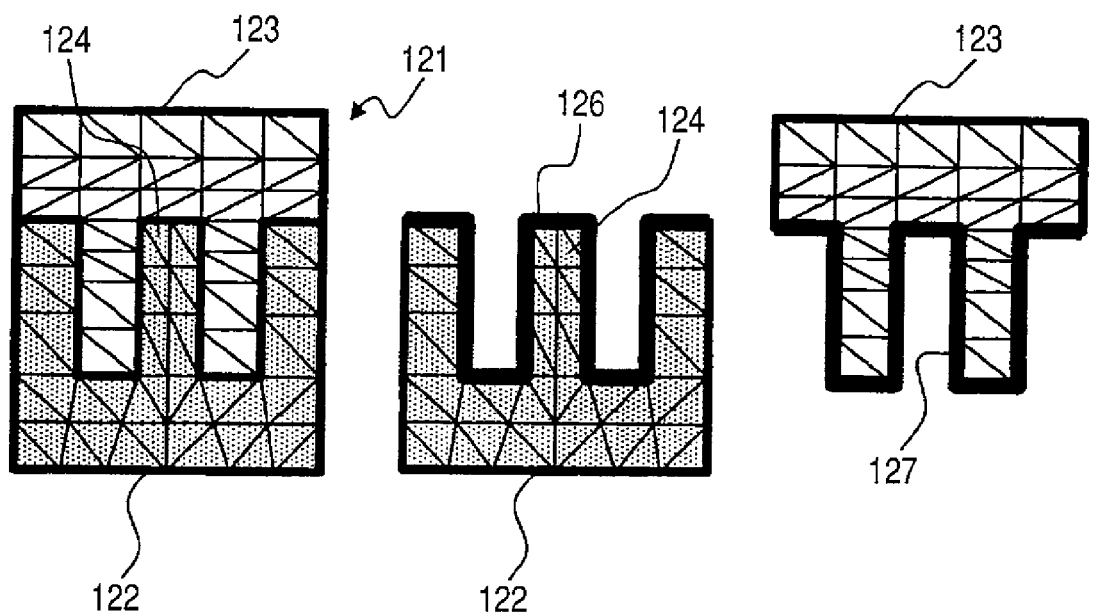
FIG. 16 shows an analytical model to be changed in analytical model creation example 3.
Figure 17:
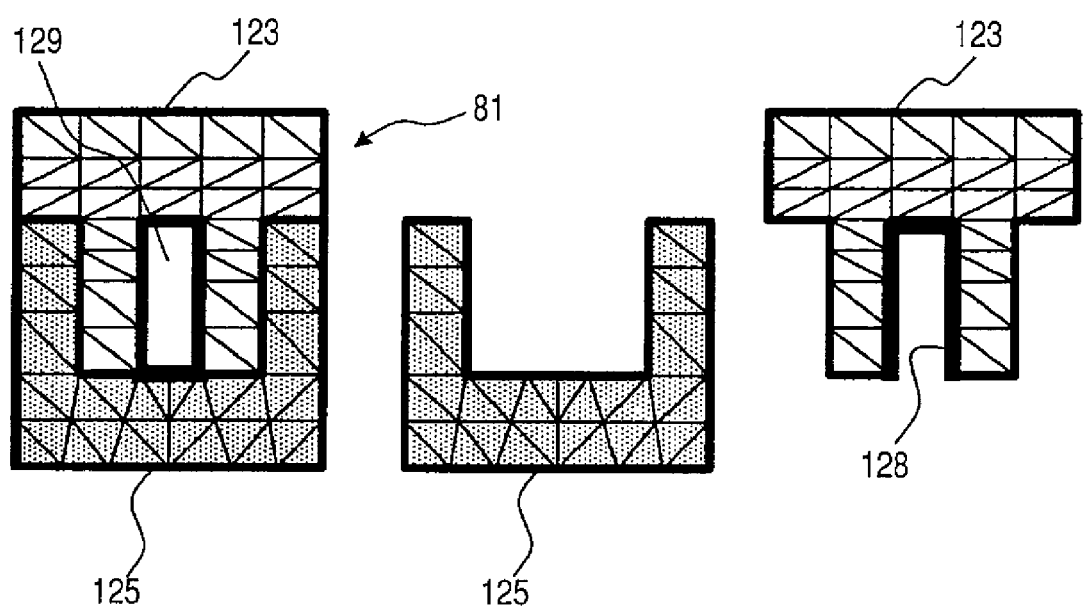
FIG. 17 shows a first-stage changed partial analytical model generated by making a first-stage shape change to a change-targeted partial analytical model in the analytical model in FIG. 16.

Example 3 of Using the Analytical Model Creation System 1 to Obtain an Analytical Model The example makes a shape change to an analytical model 121 in FIG. 16. The analytical model 121 contains a partial analytical model 122 and a partial analytical model 123. When assuming that the partial analytical model 122 is to be changed in the analytical model 121 twice. A first shape change is made to delete a protruded element 124 from the partial analytical model 122 at the center. A second shape change is made to add a shape element connecting both protruded elements at the left and right ends. In this case, the feature addition/deletion method is used to make the first shape change for deleting the protruded element 124 from the change-targeted partial analytical model 122. The change-targeted partial analytical model 122 consequently becomes a first changed partial analytical model 125 with the protruded element 124 deleted as shown in FIG. 17. The partial analytical model 123 adjacent to the first changed partial analytical model 125 is unchanged. At this time, the first changed partial analytical model 125 is not aligned to the adjacent partial analytical model 123. To solve the misalignment, the interlocking process is performed to reflect the shape change (deletion of the protruded element 124) made to the first changed partial analytical model 125 on the adjacent partial analytical model 123.

The interlocking process acquires the adjacency information before change, i.e., adjacency information about the change-targeted partial analytical model 122 and the adjacent partial analytical model 123. The process also acquires the adjacency information after change, i.e., adjacency information about the first changed partial analytical model 125 and the adjacent partial analytical model 123. In FIG. 16, element surfaces along a thick line 126 provided for the change-targeted partial analytical model 122 match nodes along a thick line 127 provided for the adjacent partial analytical model 123. The adjacency information before change is therefore acquired as a set of those node-element surface pairs. In FIG. 17, however, the first changed partial analytical model 125 does not contain element surfaces corresponding to the nodes along a thick line 128 provided for the adjacent partial analytical model 123. The adjacency information after change is therefore acquired as a set of node-element surface pairs except those nodes and element surfaces.

After acquiring the adjacency information, the process extracts a node-element surface pair containing a node to be added or deleted next. The process extracts a node-element surface pair whose node or element surface is contained in the node-element surface pair for the adjacency information before change but disappears from the surface of the changed partial analytical model. In the example of FIG. 17, element surfaces corresponding to nodes along the thick line 128 disappear from the first changed partial analytical model 125. The process extracts the node-element surface pair for each node along the thick line 128 so as to be added or deleted.

After extracting the node-element surface pair to be added or deleted, the process categorizes nodes belonging to the node-element surface pair to be added or deleted into internal and external nodes. In the example of FIG. 17, all the nodes along the thick line 128 are external nodes that are located outside the first changed partial analytical model 125.

The process adds a mesh to a gap caused by the external node. Specifically, the process recognizes a closed area formed by an element surface group along the thick line 128 containing the external node and the surface of the changed partial analytical model 125. In the example of FIG. 17, a closed area 129 is recognized. After recognizing the closed area 129, the process generates a mesh for the closed area 129 and performs a mesh additional operation that adds the closed area mesh and the partial analytical model 123.

Figure 18:
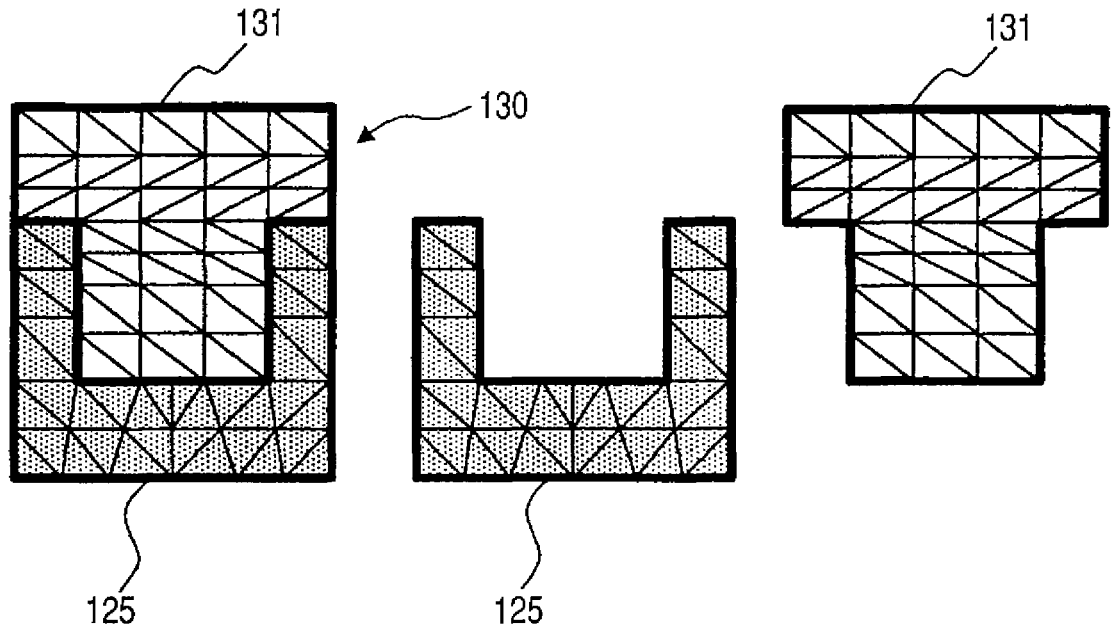
FIG. 18 shows a first-stage changed analytical model generated by making a shape change to an adjacent partial analytical model in interlock with the first-stage changed partial analytical model in FIG. 17.

The above-mentioned interlocking process creates a first changed analytical model 130 as shown in FIG. 18. The first changed analytical model 130 contains the first changed partial analytical model 125 and a first changed adjacent partial analytical model 131. The first changed adjacent partial analytical model 131 reflects the shape change in the first changed partial analytical model 125, i.e., deletion of the protruded element 124. The first changed analytical model 130 maintains the consistency as a whole.

Figure 19:
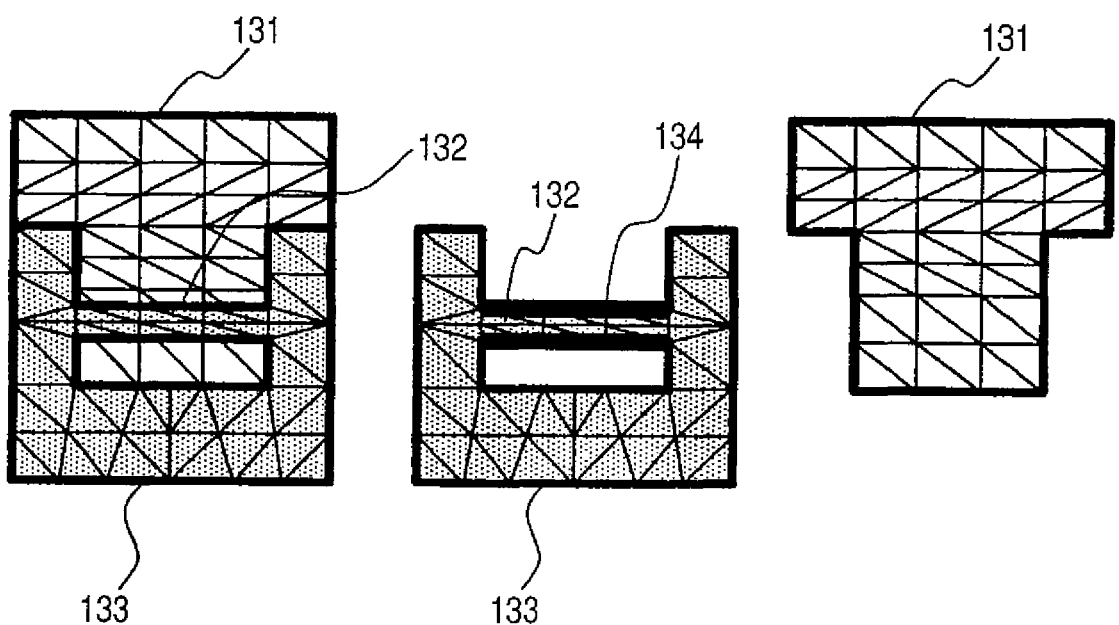
FIG. 19 shows a second-stage changed partial analytical model generated by making a second-stage shape change to the first-stage changed analytical model in FIG. 18.
Figure 20:
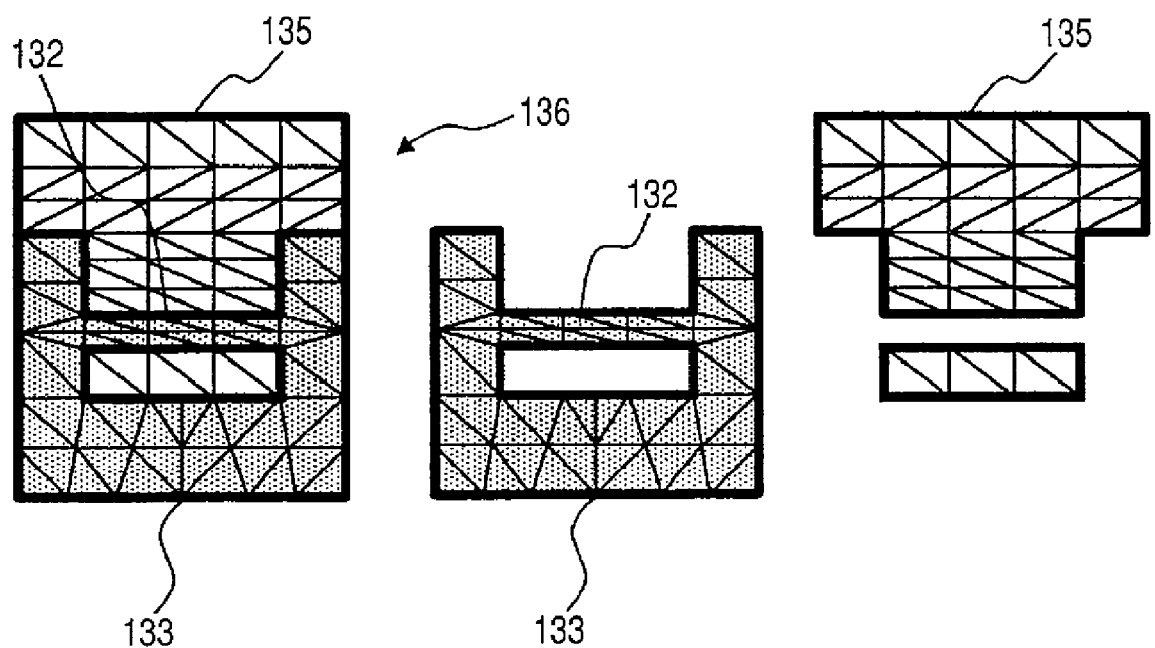
FIG. 20 shows a final desired analytical model generated by making a shape change to an adjacent partial analytical model in interlock with the second-stage changed partial analytical model in FIG. 19.

After the first changed analytical model 130 is acquired, the process adds the second shape change to the first changed analytical model 130. The second shape change is to add a shape element connecting the protruded elements at left and right ends of the first changed partial analytical model 125. The second shape change is made in accordance with a process similarly to that for the above-mentioned first shape change. As shown in FIG. 19, the process generates a second changed partial analytical model 133 appended with a shape element 132 from the first changed partial analytical model 125. The interlocking process is then performed to reflect the shape change (addition of the shape element 132) in the second changed partial analytical model 133 on the first changed adjacent partial analytical model 131. In this case, the interlocking process is used for the shape change of adding the shape element 132. Accordingly, all the nodes along the thick line 134 in FIG. 19 in the node-element surface pair to be added or deleted are internal nodes that are located inside the second changed partial analytical model 133. The process performs a mesh subtraction on a portion interfered by the internal node to subtract the second changed partial analytical model 133 from the first changed adjacent partial analytical model 131. The process finally creates a desired analytical model 136 including the second changed adjacent partial analytical model 135 and the second changed partial analytical model 133 as shown in FIG. 20.

According to example 3 of using the analytical model creation system 1 to obtain an analytical model, the protruded element 124 is deleted and then the shape element 132 is added as the first and second shape changes in order for ease of explanation. An actual process may not be necessarily performed in this order.

What is claimed is:

1. A computer-implemented analytical model creation system configured to create a desired analytical model by effecting a shape change to a combined analytical model containing a plurality of partial analytical models, the system comprising:
   a computer, including data processing hardware and storage hardware;
   a combined analytical model implemented in the computer, and having a plurality of partial analytical models;
   an interlocking change unit implemented in the computer, and configured to:
      select a partial analytical model in the combined analytical model as a change-targeted partial analytical model,
      modify the change-targeted partial analytical model, thereby generating a changed partial analytical model,
      select an adjacent partial analytical model disposed adjacent to, and interlocking with, the change-targeted partial analytical model,
      acquire adjacency information pertaining to a relationship between the change-targeted partial analytical model and the adjacent partial analytical model;
      acquire information pertaining to an adjacency relationship between the changed partial analytical model and the adjacent partial analytical model; and
      modify the adjacent partial analytical model so as to compensate for modifications made to the change-targeted partial analytical model, by effecting at least one of the following, based on the acquired adjacency information: moving a node for a mesh in the adjacent partial analytical model, deleting a mesh from the adjacent partial analytical model, and adding a mesh to the adjacent partial analytical model,
      thereby generating a modified adjacent partial analytical model that interlocks with the changed partial analytical model.

2. A computer-implemented analytical model creation system configured to create a desired analytical model by effecting a shape change to a combined analytical model containing a plurality of partial analytical models, the system comprising:
   a computer, including data processing hardware and storage hardware;
   a combined analytical model, implemented in the computer, and having a plurality of partial analytical models;
   an interlocking change unit, implemented in the computer, and configured to:
      select a partial analytical model in the combined analytical model to be a change-targeted partial analytical model,
      modify the change-targeted partial analytical model, thereby generating a changed partial analytical model,
      select an adjacent partial analytical model disposed adjacent to, and interlocking with, the change-targeted partial analytical model,
      determine adjacency information between partial analytical models by using a matching condition configured to postulate that a node is located on an element surface, wherein:
         the node is directed to a node of a mesh on a surface of the adjacent partial analytical model, and
         the element surface is directed to an element surface of a mesh in the change-targeted partial analytical model or in the changed partial analytical model; and
      modify the adjacent partial analytical model so as to incorporate modifications made to the change-targeted partial analytical model, thereby generating a modified adjacent partial analytical model that interlocks with the shape change, and such that the node is located on the element surface of the changed partial analytical model.

3. A computer-implemented analytical model creation system configured to create a desired analytical model by effecting a shape change to a combined analytical model containing a plurality of partial analytical models, the system comprising:
   a computer, including data processing hardware and storage hardware;
   a combined analytical model, implemented in the computer, and having a plurality of partial analytical models;
   an interlocking change unit, implemented in the computer, and configured to:
      select a partial analytical model in the combined analytical model to be a change-targeted partial analytical model,
      modify the change-targeted partial analytical model, thereby generating a changed partial analytical model,
      select an adjacent partial analytical model disposed adjacent to, and interlocking with, the change-targeted partial analytical model,
      modify the adjacent partial analytical model so as to incorporate modifications made to the change-targeted partial analytical mode, thereby generating a modified adjacent partial analytical model that interlocks with the shape change, and
      adjust a mesh size of the changed partial analytical model and/or the modified adjacent partial analytical model, in order to more closely equal respective mesh sizes of at least one of the change-targeted partial analytical model and/or the adjacent partial analytical model.

4. An analytical model creation system of a Computer Aided Engineering (CAE) system, configured to effect a shape change to a combined analytical model containing a plurality of partial analytical models, the analytical model creation system comprising:
   a data processing hardware including a computer configured to process a computer program, and including an input/output apparatus configured to input data needed for creating the combined analytical model and configured to output data to a display;

an analytical model database configured to store the combined analytical model as a mesh model;

a change specification section configured to specify an initial combined analytical model from the analytical model database with an operation of the input/output apparatus, to specify a target partial analytical model to be changed in shape from among partial analytical models in the initial combined analytical model by using an operation of the input/output apparatus, to specify a change portion to be changed in shape in the target partial analytical model, and to specify a change condition for a shape change, including a change method and change contents;

a change process section configured to apply the shape change to the change portion in the target partial analytical model by executing at least one of: moving a node of a mesh applicable in the target partial analytical model, deleting a node, and adding a mesh to the target partial analytical model in accordance with the change portion, the change method, and the change contents; and an adjacent partial analytical model interlocking section configured to execute an interlocking change process configured to apply a shape change to an adjacent partial analytical model that is disposed adjacent to the target partial analytical model and in interlock with the shape change of the target partial analytical model, in order to reflect a shape change applied to the target partial analytical model;

wherein the adjacent partial analytical model interlocking section is configured to execute the interlocking change process by acquiring:

adjacency information prior to shape change, that is configured to indicate an adjacency relationship between the target partial analytical model prior to any shape change and the adjacent partial analytical model prior to any shape change, and adjacency information after shape change, indicating an adjacency relationship between the target partial analytical model after a shape change and the adjacent partial analytical model prior to the shape change;

wherein the adjacent partial analytical model interlocking section is configured to, in accordance with the adjacency information prior to shape change and adjacency information after shape change: extract a node of mesh needed for the shape change in the adjacent partial analytical model, and configured to execute at least one of: moving the node for the mesh applicable in the adjacent partial analytical model, deleting the node, and adding a mesh to the adjacent partial analytical model, wherein the adjacency information prior to shape change and after shape change includes a set of: a node on a mesh surface of the adjacent partial analytical model and an element surface of the target partial analytical model, respectively, wherein the node is located on the element surface both prior to and after the shape change of the target partial analytical model.

* * * * *